(12) United States Patent
Tsujino et al.

(10) Patent No.: US 6,921,578 B2
(45) Date of Patent: Jul. 26, 2005

(54) LOW-REFLECTION GLASS ARTICLE

(75) Inventors: Toshifumi Tsujino, Osaka-fu (JP); Hideki Okamoto, Osaka-fu (JP); Tetsuro Kawahara, Osaka-fu (JP)

(73) Assignee: Nippon Sheet Glass Co., Ltd., Osaka (JP)

(*) Notice: Subject to any disclaimer, the term of this patent is extended or adjusted under 35 U.S.C. 154(b) by 369 days.

(21) Appl. No.: 09/928,836

(22) Filed: Aug. 11, 2001

(65) Prior Publication Data

US 2002/0014090 A1 Feb. 7, 2002

Related U.S. Application Data

(63) Continuation of application No. PCT/JP00/08778, filed on Dec. 12, 2000, now abandoned.

(30) Foreign Application Priority Data

Dec. 13, 1999 (JP) .......................................... H11-352970
Jan. 26, 2000 (JP) .......................................... 2000-016860

(51) Int. Cl.$^7$ ................................................ B32B 9/00
(52) U.S. Cl. ........................ 428/428; 428/432; 428/404; 428/446; 428/323; 428/332; 106/287.34; 501/12; 501/133; 501/128
(58) Field of Search .............................. 428/428, 429, 428/432, 402, 403, 404, 446, 323, 331, 332; 136/252, 256, 257, 261; 106/286.1–286, 287.34; 501/12, 133, 128

(56) References Cited

U.S. PATENT DOCUMENTS

| | | | | |
|---|---|---|---|---|
| 4,374,158 A | * | 2/1983 | Taniguchi et al. | 427/162 |
| 4,830,879 A | * | 5/1989 | Debsikdar | 427/162 |
| 5,139,980 A | * | 8/1992 | Nakahara et al. | 502/8 |
| 5,612,128 A | * | 3/1997 | Endo et al. | 428/323 |
| 5,925,438 A | * | 7/1999 | Ota et al. | 428/141 |
| 5,976,236 A | * | 11/1999 | Yoshihara et al. | 106/286.6 |

FOREIGN PATENT DOCUMENTS

| | | | |
|---|---|---|---|
| JP | 62017044 A | | 1/1987 |
| JP | 63193101 A | | 8/1988 |
| JP | 04357134 A | | 12/1992 |
| JP | 04357135 A | | 12/1992 |
| JP | 06155652 A | | 6/1994 |
| JP | 08319110 A | | 12/1996 |
| JP | 09175840 A | | 7/1997 |
| JP | 10045435 A | | 2/1998 |
| JP | 0 926 103 | * | 6/1999 |
| JP | 11292568 A | | 10/1999 |
| JP | 11-292568 | * | 10/1999 |
| JP | 11292571 A | | 10/1999 |
| WO | WO 01/65612 | * | 9/2001 |

OTHER PUBLICATIONS

Montgomery Jr., G. Paul, "Antireflection coatings for veiling glare reduction", *Optical Engineering*, Nov./Dec. 1982, vol. 21, No. 6.

* cited by examiner

*Primary Examiner*—Jennifer McNeil
*Assistant Examiner*—G. Blackwell-Rudasill
(74) *Attorney, Agent, or Firm*—Intellectual Property Law Group LLP; Otto O. Lee; Juneko Jackson (57) ABSTRACT

A low reflection film comprising silica fine particles and a binder in a weight ratio proportion of 60:40 to 95:5 is obtained by mixing starting fine particles comprising at least non-aggregated silica fine particles with a mean particle size of 40–1000 nm and/or linear (chain-like) aggregated silica fine particles with a mean primary particle size of 10–100 nm, a hydrolyzable metal compound, water, and a solvent, hydrolyzing the hydrolyzable metal compound in the presence of the starting fine particles, and then coating the prepared coating solution onto a glass base substrate and subjecting it to heat treatment.

The obtained low reflection film is a single-layer low reflection film with low reflectivity, excellent abrasion resistance, high film strength and excellent contamination removal property, and coating of the low reflection film onto glass base substrates can give low reflection glass articles.

26 Claims, 2 Drawing Sheets

LOW-REFLECTION GLASS ARTICLE

This is a continuation of International Application PCT/JP00/08778, with an international filing date of Dec. 12, 2000 and now abandoned.

BACKGROUND

The present invention relates to low reflection glass articles such as automobile glass windows, construction glass, show windows, displays, solar cell glass base substrates, solar water heater glass panels, optical glass parts and the like.

Coating of glass base substrates with films for low reflection treatment to reduce visible light reflectivity of glass base substrates is widely known. An example of a method of utilizing the light interference effect obtained by lamination of two or more films on a glass sheet to realize low reflectivity is the invention of Japanese Unexamined Patent Publication No. Hei-4-357134, which discloses automobile reflection-reducing glass with a two-layer construction, characterized in that a thin-film layer with a refractive index of n1=1.8–1.9 and a film thickness of 700–900 angstroms is coated on at least one surface of a transparent glass sheet as the first layer from the glass side, and then a thin-film layer with a refractive index of n2=1.4–1.5 and a film thickness of 1100–1300 angstroms is coated on the first thin-film as a second layer, whereby the reflectivity on the thin-film coated layer side is reduced by 4.5–6.5% for visible light on the film side entering at an incident angle of 50° to 70° with respect to the normal to the surface. The invention of Japanese Unexamined Patent Publication No. Hei-4-357135 also proposes glass with a low reflection film composed of three layers.

On the other hand, as a method of forming a single layer film on glass to reduce reflection with the film, such as the invention of Japanese Unexamined Patent Publication No. Sho-63-193101 for example, discloses an anti-reflection film obtained by coating and drying an alcohol solution of $Si(OR)_4$ (where R is an alkyl group) containing $SiO_2$ fine particles onto the surface of glass, to attach $SiO_2$ fine particles and an $SiO_2$ thin-film coating it onto the glass surface.

The invention described in Japanese Unexamined Patent Publication No. Sho-62-17044 discloses an anti-reflection film obtained by mixing a metal alcoholate such as tetraethoxysilane with colloidal silica with a particle size of 5–100 nm in a proportion of 1 mole of the metal alcoholate to 1 mole of the colloidal silica, hydrolyzing a mixed solution obtained by dissolving it in an organic solvent such as alcohol, and coating the partially condensed sol solution onto an optical element surface, and heat treating it.

Also, the invention described in Japanese Unexamined Patent Publication No. Hei-11-292568 discloses visible light low reflection glass obtained by forming a low reflection film with a thickness of only 110–250 nm, containing linear silica fine particles and silica at 5–30 wt % with respect thereto.

It is known, as described in Optical Engineering, Vol.21, No.6, (1982), page 1039-, that such low reflection films which are single-layer low refractive index layers have low incident angle dependence of reflectivity, and that their low wavelength dependence of reflectivity results in a wide wavelength region of low reflection.

The method of coating a glass base substrate with a coating comprising two or more laminated film layers can reliably provide low reflection of visible light, but since the film thickness must be strictly specified to satisfy the interference conditions and the coating must be performed at least twice, the production costs are undesirably increased. Moreover, films of two or more layers have higher incident angle dependence of reflectivity, and therefore the reflectivity is not always lowered outside of the designed incident angle range. In this respect, coating a glass base substrate with a single-layer low reflection film with a low refractive index results in a wider wavelength range of low reflectivity.

With the anti-reflection films disclosed in Japanese Unexamined Patent Publications No. Sho-62-17044 and No. Sho-63-193101, the anti-reflection performance provided is insufficient. Also, the visible light low reflection glass disclosed in Japanese Unexamined Patent Publication No. Hei-11-292568, while being a single-layer low reflection film that realizes low reflectivity and exhibits sufficient film strength in evaluation by surface abrasion such as a back-and-forth abrasion test, is also associated with the problem of inadequate film strength in most stringent abrasion resistance tests such as the Taber abrasion test. In addition, in the case of oil adhesion which cannot be removed by wiping with a dry or wet cloth, the problem of increased reflectivity occurs.

It is an object of the present invention to provide a low reflection film for visible light or infrared light, which exhibits low reflectivity with a single layer, has high film strength as evaluated by anti-abrasion tests, and exhibits excellent contamination resistance.

SUMMARY

The present invention relates to a low reflection glass article obtained by forming a low reflection film composed of silica fine particles and a binder on a glass base substrate, the low reflection glass article being characterized in that the low reflection film contains the silica fine particles and the binder in a weight ratio proportion of 60:40 to 95:5, and in that the low reflection film is formed by coating a coating solution onto the glass base substrate and subjecting it to heat treatment, said coating solution being prepared by mixing (1) starting fine particles comprising non-aggregated silica fine particles with a mean particle size of 40–1000 nm and/or linear (chain-like) aggregated silica fine particles with a mean primary particle size of 10–100 nm, (2) a hydrolyzable metal compound, (3) water, and (4) a solvent and then hydrolyzing the hydrolyzable metal compound in the presence of the starting fine particles.

The silica fine particles used for the invention may be produced by any production method, and are typically silica fine particles synthesized by reacting a silicon alkoxide by a sol-gel method in the presence of a basic catalyst such as ammonia, colloidal silica prepared from a sodium silicate starting material, or fumed silica synthesized in a gas phase as an example. The structure of the resulting low reflection film can be widely varied based on the particle size of the silica fine particles. If the particle size of the silica fine particles is too small, the pores produced between the particles in the low reflection film will be too small which will increase capillary force, making it difficult to remove adhered contamination, while moisture and organic substances in the air gradually become incorporated into the pores thereby increasing the reflectivity as time progresses. Furthermore, since an upper limit is placed on the amount of binder used for adhesion between the silica fine particles and between the silica fine particles and the glass base substrate, as will be described below, too small a particle size of the silica fine particles will mean a relative increase in the fine particle surface area, such that the amount of binder reacting with the surface will be insufficient and the adhesive force of the film will as a result be weaker. Also, if the silica fine particle size (primary particle size) is too small, the apparent refractive index will increase with the lower irregularity roughness value of the formed film surface or the internal void volume of the film (the proportion between the non-binder-filled space between the silica fine particles with respect to the film volume).

Consequently, the mean primary particle size of the silica fine particles (refractive index: approximately 1.45) is preferably at least 40 nm and more preferably at least 50 nm, in order to (1) facilitate removal of contamination on the low reflection film, (2) increase the film strength and (3) reduce the apparent refractive index to approach the square root (approximately 1.22) of the refractive index (approximately 1.5) of the glass base substrate on which the low reflection film is coated.

If the particle size of the silica fine particles is too large, light scattering is intensified and adhesion with the glass base substrate is weakened. For uses which require visual transparency, i.e. uses for which a low haze value, such as a haze value of 1% or lower, is desired, for example, in automobile and construction windows, the mean particle size of the silica fine particles is preferably no greater than 500 nm, and more preferably no greater than 300 nm. A more preferred mean particle size range for the silica fine particles is 50–200 nm, and even more preferably 70–160 nm.

On the other hand, for uses which do not require visual transparency and do not demand very high film strength, for example, in solar cell glass base substrates, it is important to increase the transmittance by lowering the reflectivity. In order to increase the sunlight absorption efficiency in the silicon film provided in contact with the glass base substrate, it is advantageous to lengthen the optical path length in the silicon film for sunlight incident to the silicon film. Light passing through the low reflection film can be separated into rectilinear transmitted light and scattered transmitted light, and increasing the amount of scattered transmitted light with respect to the amount of rectilinear transmitted light increases the haze value. When compared to using a low reflection film wherein the total light transmittance is identical (and therefore the reflectivity is identical), a low reflection film which increases the amount of scattered transmitted light of the light passing through the low reflection film, i.e. a low reflection film with a high haze value, such as a low reflection film with a haze value of 10–80%, for example, is preferred for the aforementioned lengthening of the optical path. For a low reflection film with such a large haze value it is preferred to use silica fine particles with a mean particle size of 100–1000 nm.

The mean particle size of the silica fine particles used as the starting fine particles is defined as the value d averaged for a given number of fine particles (n=100) according to the following formula (1), based on measurement of the diameters (averages of long and short diameters) of the actual primary particles (individual primary particles in cases where they aggregate to form linear secondary particles) in the planar visual field with a transmission electron microscope at 10,000–50,000 magnification. This measured value therefore differs from the particle size determined by the BET method used for colloidal silica and the like. The sphericity of the silica fine particles is represented by the ratio of the long axis length and the short axis length of each of the particles, and is averaged among 100. The standard deviation which represents the particle size distribution of the fine particles is determined from the diameters according to the following formulas (2) and (3). In each of the formulas (1) to (3), n=100.

$$d = \left(\sum_{i=1}^{n} d_i\right)/n \tag{1}$$

$$\sigma = \sqrt{\frac{\sum_{i=1}^{n}(d-d_i)^2}{n-1}} \tag{2}$$

$$\text{Standard deviation} = (d+\sigma)/d \tag{3}$$

The sphericity of the silica fine particles is preferably 1.0–1.2, because a low reflection film with an increased degree of fine particle packing will be formed, thereby increasing the mechanical strength of the film. The sphericity is even more preferably 1.0–1.1. Also, using silica fine particles with a uniform particle size can increase the voids between the fine particles, thereby lowering the apparent refractive index of the film and lowering the reflectivity. Thus, the standard deviation of the particle size indicating the particle size distribution of the silica fine particles is preferably 1.0–1.5, more preferably 1.0–1.3 and most preferably 1.0–1.1.

As suitable non-aggregated silica fine particles with a mean particle size of 40–1000 nm there may be mentioned the commercially available products "SNOWTEX OL", "SNOWTEX YL" and "SNOWTEX ZL" by Nissan Chemical Co., and "SEAHOSTAR KE-W10", "SEAHOSTAR KE-W20", "SEAHOSTAR KE-W30", "SEAHOSTAR KE-W50", "SEAHOSTAR KE-E70", "SEAHOSTAR KE-E90", etc. by Nippon Shokubai Co., Ltd. Silica fine particles are preferably in the form of a silica fine particle dispersion in a solvent, for ease of handling. The dispersion medium may be water, an alcohol, a cellosolve, a glycol or the like, and silica fine particle dispersions in these dispersion media are commercially available. Silica fine particle powder may also be used in the form of dispersions in these dispersion media.

When several of the fine particles aggregate to form aggregated fine particles (secondary fine particles), the mean particle size of each of the individual fine particles (primary particles) composing these aggregated fine particles is defined as the mean primary particle size. If the aggregates of the fine particles have aggregated in a non-branched linear or branched linear fashion (linear (chain-like) aggregated fine particles), each of the fine particles is fixed in that aggregated state during the film formation, resulting in a highly bulky film, and the irregularity roughness value of the formed film surface and the film interior void volume increase with respect to the non-aggregated silica fine particles having a mean particle size equivalent to the mean primary particle size of the linear(chain-like) aggregated fine particles. Thus, the linear (chain-like) aggregated silica fine particles used may be linear (chain-like) aggregated silica fine particles having a mean primary particle size of less than 40 nm or a mean primary particle size d of 10–100 nm. The linear (chain-like) aggregated silica fine particles preferably have an average length (L) of 60–500 nm and an average length to mean primary particle size ratio (L/d) of 3–20. Examples of such linear (chain-like) aggregated silica fine particles include "SNOWTEX OUP" and "SNOWTEX UP", by Nissan Chemical Co.

The coating solution for formation of the low reflection film is prepared by hydrolysis of a hydrolyzable metal compound in the presence of the silica fine particles, and the mechanical strength of the resulting film is thereby drastically improved. When the metal compound is hydrolyzed in the presence of the silica fine particles, a condensation reaction between the product of hydrolysis and the silanol present on the fine particle surfaces occurs almost simultaneously with the hydrolysis, and (1) the condensation reaction with the binder component improves the reactivity of the fine particle surfaces, while (2) as the condensation reaction proceeds, the silica fine particle surfaces become coated with the binder, so that the binder can be effectively utilized to enhance the adhesion between the silica fine particles and the glass base substrate.

On the other hand, hydrolysis of the metal compound in the absence of fine particles leads to high molecular formation of the binder component by condensation reaction between the hydrolysis products. When the high molecular binder component and the silica fine particles are combined to prepare a coating solution, (1) almost no condensation reaction occurs between the binder component and silica fine particles, resulting in poor reactivity of the fine particle surfaces, and (2) the silica fine particle surfaces are almost uncovered with the binder. Consequently, when it is attempted to increase the adhesion between the glass and silica fine particles in the manner described above, a much larger amount of binder is required.

Figure 1:
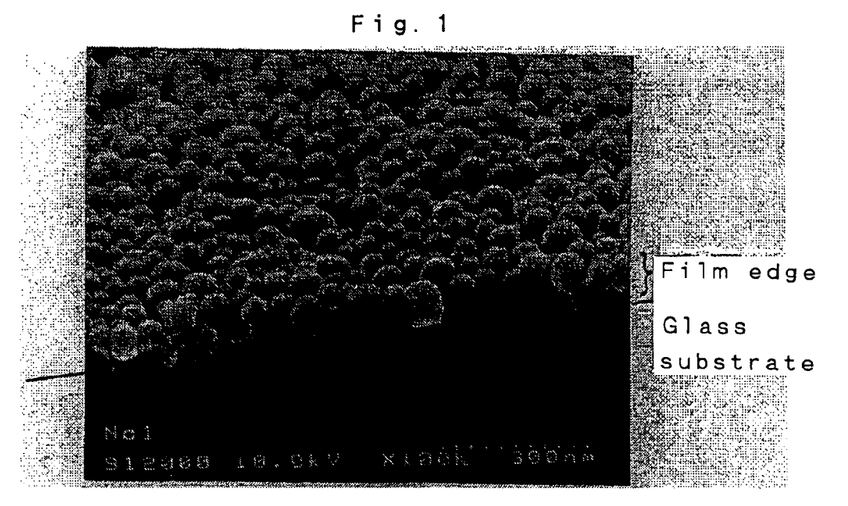
FIG. 1 is an electron microscope image of the structure of a low reflection film according to an example of the invention.
Figure 2:
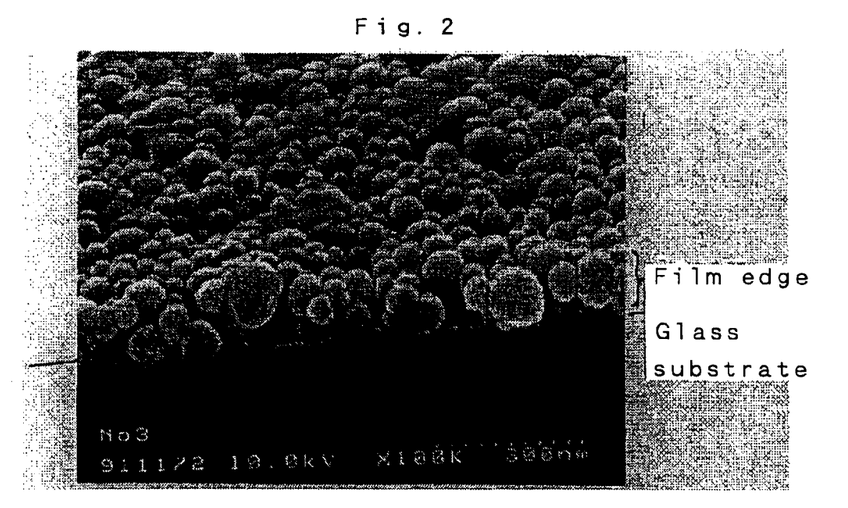
FIG. 2 is an electron microscope image of the structure of a low reflection film of a comparative example.

A scanning electron microscope (SEM) at 100,000 magnification was used to compare a film B (comparative example) fabricated using a coating solution prepared by mixing colloidal silica (mean particle size: 50 nm, "SNOWTEX OL" by Nissan Chemical Co.) and pre-hydrolyzed tetraethoxysilane at a solid ratio of 80:20, and then further adding a hydrolyzing catalyst, water and a solvent, and a film A (present invention) fabricated using a coating solution prepared by mixing the colloidal silica and tetraethoxysilane at a solid ratio of 80:20, and then further adding the hydrolyzing catalyst, water and a solvent and stirring at 25° C. for 24 hours for hydrolysis of the tetraethoxysilane in the presence of the colloidal silica. FIGS. 1 and 2 show, respectively, SEM photographs of the edge sections (cross-sections) of films A and B as seen from an upper slant angle of 30° from the film plane. Both of the films have silica fine particles layered on glass base substrates. The 11 white dots at the lower right indicate a distance of 300 nm from both ends of the line of dots.

In FIG. 2 (film B), a rather thick film-like adhesion can be seen covering the surface of several of the silica fine particles aligned adjacent to the film surface. The film-like adhesion is believed to be the binder component from the tetraethoxysilane, and therefore in FIG. 2 (film B), the amount of binder that ought to work for effective adhesion between the fine particles and between the fine particles and the base substrate is thought to be lower due to the film-like adhesion. If the tetraethoxysilane content is increased to increase the amount of binder that ought to work for effective adhesion, then the spaces between the fine particles and the spaces between the fine particles and the base substrate surface are reduced thus increasing the apparent refractive index of the film, and making it difficult to lower the reflectivity.

In FIG. 1 (film A), such film-like adhesion is either unobservable or does not exist, and it is therefore surmised that all of the binder component uniformly covers the surfaces of the silica fine particles, so that the binder effectively acts for adhesion between the fine particles and between the fine particles and the base substrate.

The preparation method for film A allows the binder component content to be decreased while maintaining film strength, and can achieve a lower apparent refractive index of the film, thus resulting in both supported film strength and reduced reflectivity of the film. According to the method for film A, even if the binder amount is reduced to half, it is possible to achieve equivalent film strength compared to film B prepared using a coating solution with silica fine particles mixed with the pre-hydrolyzed binder.

The judgment standard for the film strength was based on the results of determining the residual film with a Taber abrasion test according to JIS-R3212 and JIS-R3221 using a CS-10F rotating wheel, with 1000 rotations at a load of 500 g (JIS-R3212) or 200 rotations at a load of 500 g (JIS-R3221), and measuring the haze value before and after the Taber abrasion test.

The binder of the invention is composed of a metal oxide, and it is preferred to use at least one metal oxide selected from the group consisting of silicon oxides, aluminum oxides, titanium oxides, zirconium oxides and tantalum oxides. The weight ratio of the silica fine particles and binder forming the low reflection film is in the range of 60:40 to 95:5. If the binder amount is above this range, the fine particles become embedded in the binder which reduces the fine particle-based irregularity roughness value or the film void volume, thus reducing the anti-reflection effect. If the binder amount is below this range, the adhesive force between the fine particles and between the glass base substrate and fine particles is reduced, leading to weak mechanical strength of the film. Considering the balance between the reflectivity and the film strength, the weight ratio of the silica fine particles and the binder is more preferably 65:35 to 85:15. The binder preferably covers the entire surfaces of the silica fine particles, and the coating thickness is preferably 1–100 nm which is 2–9% of the mean particle size of the silica fine particles.

The hydrolyzable metal compound as the binder starting material is suitably a metal alkoxide of Si, Al, Ti, Zr, Ta or the like, for film strength and chemical stability. Of these metal alkoxides it is preferred to use silicon tetraalkoxides, aluminum trialkoxides, titanium tetraalkoxides and zirconium tetraalkoxides, with methoxides, ethoxides, propoxides and butoxides being particularly preferred. For films with particularly high binder component contents, the refractive index of the binder component will affect the reflectivity, and therefore silicon alkoxides and especially silicon tetraalkoxides or oligomers thereof, which have low refractive indexes, are most suitable. The binder component used may also be a combination of more than one of these metal alkoxides. Other than metal alkoxides, there are no particular restrictions so long as a reaction product of $M(OH)_n$ is obtained by hydrolysis, and for example, there may be mentioned metal halides and metal compounds with isocyanate groups, acyloxy groups, aminoxy groups and the like. In addition, compounds represented by $R^1{}_n M(OR^2)_{4-n}$ (where M is a silicon atom, $R^1$ is an organic functional group such as an alkyl group, amino group, epoxy group, phenyl group or methacryloxy group, $R^2$ is, for example, an alkyl group, and n is an integer of 1–3), which are a type of silicon alkoxide, may also be used as binder starting materials. Using such compounds represented by $R^1{}_n M(OR^2)_{4-n}$ leaves an organic residue on the gel film after coating, and therefore if this is used for all of the binder starting material the organic residue portions become fine pores on the nanometer level after heat treatment, and the small size of the fine pores increases the capillary force, making it difficult to remove adhered contaminants and causing other problems such as inclusion of contaminants and water in the fine pores which results in change in the reflectivity over time, while the film strength is also weakened; compounds represented by $R^1{}_n M(OR^2)_{4-n}$ are therefore preferably not used in large amounts, and are limited to, for example, within 50 wt % in terms of the metal oxide with respect to the total binder.

The haze value of the low reflection film-coated glass article is the total of the haze value of the glass base substrate itself and the haze value of the low reflection film, and the glass base substrate used for the invention should have as small a haze value as possible, such as a haze value of no greater than 0.1%. Thus, the haze value of a low reflection glass article of the invention is approximately equal to the haze value of the low reflection film. The haze value of the low reflection film is preferably adjusted to the optimum range which will differ depending on the use. For example, for an automobile window, a lower haze value is preferred from the standpoint of safety, while the haze value for low reflection glass articles is no greater than %, and preferably no greater than 0.5%.

On the other hand, for solar cell glass base substrates which require effective utilization of solar energy, increased multiple reflection in a film of polycrystalline silicon, monocrystalline silicon, amorphous silicon or the like formed close to the glass sheet to lengthen the optical path can allow more effective utilization of incident light for enhanced transformation efficiency. For this purpose, as mentioned above, a low reflection film with a high degree of scattered transmitted light, i.e. a low reflection film with a high haze value, is most suited.

A solar cell glass sheet with lowered reflectivity and increased scattered transmission is effective to raise the total light transmittance (total light transmittance of rectilinear transmitted light and scattered transmitted light) and lengthen the optical path in the silicon, and a most notable effect is achieved with a haze value of 10% or higher. If the haze value exceeds 80%, the effect of lowered reflectivity (increased transmittance) is almost eliminated. Thus, a solar cell glass sheet according to the invention preferably has a haze value of 10–80%.

However, the haze value may exceed 80% in cases where an increase in scattered light intensity is desired instead of a high total light transmittance or in cases where the outer appearance is important, such as for reduced front reflection (to prevent mirror image reflection). When high film strength is demanded, the haze value for a solar cell glass sheet is typically no greater than 30%. A method of achieving both anti-reflection performance and light scattering transmission is to use two types of fine particles with different mean particle sizes as the non-aggregated silica fine particles used in the low reflection film coating solution, namely (1) 70–95 wt % of a first type of non-aggregated silica fine particles with a mean particle size of 40–200 nm and (2) 5–30 wt % of a second type of non-aggregated silica fine particles with a mean particle size of more than 200 nm to 3000 nm or less and at least 100 nm larger than the mean particle size of the first type of non-aggregated silica fine particles.

In the low reflection film obtained using these non-aggregated silica fine particles, 30–90% of the area seen from above the film is occupied by fine particles with a mean particle size of 40–200 nm, while no more than 50% and preferably 1–30% of the area is occupied by fine particles with a mean particle size of 200–3000 nm. The occupied area is the area occupied by the fine particles per unit area of the film as seen from the normal to the glass surface.

When the fine particles overlap, the occupied area is determined by the area of the uppermost fine particles. There is no need for all of the surface section of the base substrate to be occupied by fine particles. Anti-reflection performance is obtained in the fine particle-occupied sections in the former case, while light scattering transmission performance is obtained in the fine particle-occupied sections in the latter case. It is thus possible to increase the haze value to 30% while maintaining low reflectivity.

When non-aggregated fine particles of a uniform particle size are arranged in one level on the glass base substrate, the relationship between the fine particle sizes and the haze value may be indicated as follows with a fine particle content of 80 wt % and a binder content of 20 wt %: the haze value is about 10% for a film formed with fine particles of particle size 200 nm alone, about 20% for 300 nm, about 55% for 500 nm and about 70% for fine particles with a particle size of 700 nm. For fine particles with a particle size of 900 nm or greater, the haze value exceeds 70%.

A greater low reflection effect enhances the safety for automobiles and increases the usable light energy for solar cell base substrates, and therefore the reflectivity is preferably lower with a reflectivity from the film side of no greater than 2%, preferably no greater than 1% and more preferably no greater than 0.7%.

The structure of the low reflection film is preferably such that the silica fine particles covered with the binder on their surfaces (hereunder referred to simply as fine particles) almost totally cover the surface of the glass base substrate, for reduced reflectivity of the film. When fine particles of exactly the same particle size are packed to maximum density in one layer on the glass base substrate, the area occupied by the fine particles as seen from above is theoretically about 90%. For a low reflection film with only a single layer of fine particles, the occupied area is 50% or greater, and preferably 70% or greater, in order to achieve low reflection performance. If the occupied area is less than 50%, exposure of the glass base substrate surface results in strong reflection due to the difference in refractive indexes of the glass and air, such that reflection cannot be reduced.

The structure of the low reflection film may be such that the fine particles are arranged in a single layer on the upper glass surface, or that the fine particles are layered in multiple levels. With either a single layer or multilayer structure, the pores corresponding to the fine particle size are formed by the gaps between the glass base substrate and fine particles or the gaps between the fine particles themselves, and these spaces are effective for lowering the apparent refractive index. When the film is observed with an electron microscope from directly above the film, the total number of the fine particles aligned in a planar fashion on the uppermost surface of the film and the fine particles located under the uppermost surface fine particles but slightly visible between the gaps between the uppermost surface fine particles is 30–3000 in a 1 $\mu$m 1 $\mu$m square area, when using non-aggregated silica fine particles with a mean particle size of 40–500 nm as the starting fine particles, and these fine particles preferably have a mean particle size of 40–500 nm. The total number is more preferably from 100 to 1000.

When using non-aggregated silica fine particles with a mean particle size of 100–1000 nm as the starting fine particles, the total number of the fine particles is 10–50,000 in a 10 $\mu$m×10 $\mu$m square area, and the fine particles preferably have a mean particle size of 100–1000 nm. The total number is more preferably from 20 to 25,000.

The fine particle density depends on the sizes of the fine particles, with a larger fine particle size resulting in a smaller number, and a smaller fine particle size resulting in more particles. Rather than having the fine particles simply held on the glass base substrate, it is preferred for increased film strength to employ a structure wherein the fine particles are in dense contact and bonded together by the binder. For example, when the mean particle size of the fine particles is D nm, the number of fine particles in a 10 $\mu$m×10 $\mu$m square film observed using an electron microscope directly above the film is preferably from $5,000,000/D^2$ to $10,000,000/D^2$.

The average thickness of the low reflection film of the invention is defined below. An image of a cross-section of the film as observed with an electron microscope at 50,000× magnification is prepared. A 10 cm (actually 2 $\mu$m) length of the electron microscope image is taken, and after selecting 12 locations in order from the largest height, the average thickness is determined as the average height value from the base substrate surface among the 10 heights from the 3rd to 12th ones counting from the highest one. If 12 heights cannot be selected because the sizes of the fine particles are large or the particles are sparsely dispersed, the magnification of the electron microscope is gradually decreased from 50,000, and the average thickness is determined by the above-mentioned method when 12 heights can be selected.

A film with an average thickness in the range of 90 to 180 nm has the lowest reflectivity in the visible light region. The value of the physical thickness (d) defined by the optical thickness (n·d) is smaller than the average thickness, and the physical thickness (d) corresponding to the average thickness of 90–180 nm is 80–140 nm. This is in order to satisfy the interference conditions for reflected light at the glass/film interface and film/air interface. The interference conditions are established even at 2n-1 times the thickness mentioned above (where n is a natural number), and therefore although the reflectivity reduces even with a thickness of 3 times or greater, this is undesirable since the film loses strength.

On the other hand, considering the region spanning both visible light (400–780 nm) and infrared light (780 nm–1.5 $\mu$m) as the region in which reflectivity is to be reduced, the average thickness of the low reflection film is preferably from 90 nm to 350 nm. This corresponds to a physical thickness d of 80 nm to 300 nm.

Particularly for automobile window seals, since the mounting angle (the inclination angle from the vertical surface) is around 60°, a film design corresponding to the method of use is necessary. The surface reflectivity (not including the back side reflection) of soda lime glass which has a refractive index of 1.52 is 4.2% with an incident angle of 12°, but the surface reflectivity with an incident angle of 60° (the incident angle corresponds to the angle of incidence of light from the horizontal direction with respect to the window seal mounted on the automobile) reaches 9% or greater.

The low reflection film composed of the fine particles and binder approaches the porous single layer film with the average refractive index, but low reflection performance is achieved by utilizing the interference effect of the reflected light at the glass/low reflection film interface and reflected light at the low reflection film/air interface, to shift the half-wavelength of the optical path difference between the reflected light. When the incident angle to the low reflection film-formed glass is increased, the optical path difference tends to become smaller, so that it becomes necessary to increase the optical thickness (nd) of the low reflection film compared to vertical incident reflection. In order to reduce the reflectivity with 60° incidence, the optical thickness is preferably designed to be about 140–250 nm.

The surface reflectivity with an incident angle of 600 depends largely on the apparent refractive index and optical thickness of the low reflection film, and is no greater than 6%, preferably no greater than 5% and more preferably no greater than 4%.

According to the invention, the coating solution for the low reflection film is obtained by hydrolyzing a mixture of silica fine particles, a hydrolyzable metal compound, a catalyst for hydrolysis, water and a solvent. For example, reaction is conducted at room temperature for 1–24 hours while stirring, or else reaction may be conducted at a temperature higher than room temperature, such as 40–80° C., for 10–50 minutes while stirring. The resulting coating solution may also be diluted with an appropriate solvent depending on the coating method to be used.

The hydrolysis catalyst is most effectively an acid catalyst, examples of which include mineral acids such as hydrochloric acid and nitric acid, or acetic acid, etc. With an acid catalyst, the condensation polymerization reaction rate is slower than the hydrolysis reaction rate of the hydrolyzable metal compound, such as a metal alkoxide, and the hydrolysis reaction product $M(OH)_n$ is produced in a large amount, which is preferred to allow efficient action as a binder. With a basic catalyst, the condensation polymerization reaction rate is faster than the hydrolysis reaction rate, and therefore the metal alkoxide becomes a fine particulate reaction product and is used for particle size growth of the originally present silica fine particles, which results in a lower effect of the metal alkoxide as a binder. The catalyst content is preferably 0.001–4 in terms of molar ratio with respect to the metal compound as the binder.

The amount of water necessary for hydrolysis of the metal compound may be 0.1–100 as the molar ratio with respect to the metal compound. If the water is added at less than 0.1 in terms of the molar ratio, the hydrolysis of the metal compound will not proceed adequately, whereas if it is greater than a molar ratio of 100, the stability of the solution will tend to be undesirably reduced.

When a chloro group-containing compound is used as the metal compound, addition of a catalyst will not always be necessary. The chloro group-containing compound can undergo hydrolysis reaction even without a catalyst. However, there is no problem with further addition of an acid.

The solvent may basically be any one which can substantially dissolve the metal compound, but most preferred are alcohols such as methanol, ethanol, propanol and butanol, cellosolves such as ethylcellosolve, butylcellosolve and propylcellosolve, and glycols such as ethylene glycol, propylene glycol and hexylene glycol. If the concentration of the metal compound dissolved in the solvent is too high, although the amount of dispersed silica fine particles is also a factor, sufficient gaps may not be produced between the fine particles, and therefore the content is preferably no greater than 20 wt % and more preferably 1–20 wt %. The proportion of the amount of silica fine particles and the metal compound (in terms of the metal oxides $SiO_2$, $Al_{23}$, $TiO_2$, $ZrO_2$ or $Ta_2O_5$) in the coating solution is preferably 60:40 to 95:5 and more preferably 65:35 to 85:15, in terms of weight.

A preferred starting material mixing ratio for the coating solution of the invention is listed in Table 1 below.

TABLE 1

| | |
|---|---|
| Hydrolyzable metal compound (in terms of metal oxide) | 100 parts by weight |
| Starting fine particles comprising either or both non-aggregated silica fine particles of mean particle size 40–1000 nm and linear (chain-like) aggregated silica fine particles of mean primary particle size 10–100 nm | 150–1900 parts by weight |
| Water | 50–10,000 parts by weight |
| Acid catalyst | 0–200 parts by weight, preferably 0.01–200 parts by weight |
| Solvent | 1000–500,000 parts by weight |

The coating solution is coated onto a glass base substrate and heated for dehydration condensation reaction of the metal compound hydrolysate and gasification and combustion of the volatile components, to form a low reflection film on the glass base substrate.

The coating method is not particularly limited and may be any publicly known technique, and methods using such apparatuses as spin coaters, roll coaters, spray coaters and curtain coaters, methods such as dip coating, flow coating and the like or printing methods such as screen printing, gravure printing, curve printing or the like may be used. Glycols are effective solvents in coating methods requiring high-boiling-point solvents, for example, in printing methods such as flexo printing and gravure printing, and while the reason is not fully understood, glycols are suitable solvents because they suppress aggregation of the fine particles and form low reflection films with low haze values. The weight proportion of the glycol in the coating solution may be from 5–80%.

Depending on the glass base substrate it may not be possible to achieve uniform coating due to repellence of the coating solution, but this can be improved by washing the base substrate surface or carrying out surface modification. As methods of washing or surface modification there may be mentioned degreasing washing with an organic solvent such as alcohol, acetone, hexane or the like, washing with an alkali or acid, methods of surface polishing with polishing agents, or methods such as ultrasonic washing, ultraviolet irradiation treatment, ultraviolet ozone treatment, plasma treatment, etc.

The heating treatment after the coating is effective to increase the adhesion of the film composed of the silica fine particles and binder with the glass base substrate. The treatment temperature is preferably a maximum temperature of 200° C. or higher, preferably 400° C. or higher and more preferably 600° C. or higher, up to 1800° C. At 200° C. or higher, the solvent component in the coating solution evaporates, leading to gelling of the film and increased adhesive force. At 400° C. or higher, the organic components remaining in the film are almost completely removed by combustion. At 600° C. or higher, the residual unreacted silanol groups and hydrolyzed groups of the metal compound hydrolysates undergo almost complete condensation reaction, leading to densification of the film and improved film strength. The heating time is preferably from 5 seconds to 5 hours, and more preferably from 30 seconds to one minute.

The low reflection film of the invention may be formed on one side or on both sides of the glass base substrate. When both sides of the glass sheet are to be used against a medium such as air or a gas with a refractive index of nearly 1, formation of the film on both surfaces of the glass base substrate can give a better anti-reflection effect. However, when one surface of the glass base substrate is to be used against a medium with a refractive index near the refractive index of the glass base substrate, for example, with sandwich glass wherein two glass base substrates are bonded via a transparent resin layer such as polyvinylbutyral, visible light reflection at the interface between the glass sheet and transparent resin layer can be ignored, and therefore the low reflection film may be formed only on the outer surface of each glass sheet, instead of being formed on the glass base substrate surfaces facing the transparent resin layer.

When a low reflection glass article of the invention is to be used in an automobile, for example, the glass sheet coated with the low reflection film may be further coated on the surface with a water-repellent film or anti-fogging film. Coating a water-repellent film can provide water-repellent performance, as well as enhanced contamination removal in the case of adhesion of contaminants. The water-repellency obtained by coating a water-repellent film on the low reflection film of the invention exhibits more excellent water-repellent function than when a water-repellent agent is used on an untreated glass base substrate surface. Coating an anti-fogging film can provide anti-fogging performance, as well as enhanced contamination removal in the case of adhesion of contaminants. The low reflection film may be coated on both sides of the glass sheet (or sandwich glass sheet) with the water-repellent film coated thereover, or the low reflection film may be coated on one surface of the glass sheet and the water-repellent film coated over both the low reflection film side and the untreated glass surface, or on either side.

Likewise, the low reflection film may be coated on both sides of the glass sheet (or sandwich glass sheet) with the anti-fogging film coated thereover, or the low reflection film may be coated on one surface of the glass sheet (or sandwich glass sheet) and the anti-fogging film coated over both the low reflection film side and the untreated glass surface, or on either side.

Preferably, the low reflection film is coated on both surfaces of the glass sheet (or sandwich glass sheet), an anti-fogging film coated on one surface of the film (car interior or room interior side), and a water-repellent film coated on the other side of the film (car exterior or room exterior side), and more preferably, the low reflection film is coated onto only one surface (car interior or room exterior side) of the glass sheet (or sandwich glass sheet), an anti-fogging film coated on the surface of that film, and a water-repellent film coated on the other surface of the glass base substrate (car exterior or room exterior side). The reflectivity is virtually unchanged even when such an anti-fogging film and water-repellent film are coated on the low reflection film, and therefore low reflectivity is maintained.

The transparent glass base substrate of the invention is preferably a transparent glass article with a refractive index of 1.47–1.53, and preferably there may be used a colorless glass base substrate or a green- or bronze-colored glass sheet with a composition of, for example, soda-lime silicate glass, borosilicate glass or aluminosilicate glass, a glass sheet with a function of blocking ultraviolet light or heat rays, or a transparent glass base substrate made of a glass material in a different shape than a sheet, but still provided with the aforementioned composition, coloring or performance, having a thickness of 0.2–5.0 mm, a visible light transmittance Ya of 70% or greater, and a haze value of no greater than 0.1%. When it is to be used as a front glass sheet for a solar cell panel, or as a solar cell glass base substrate such as a base glass base substrate for a solar cell, the thickness is preferably 0.2–5.0 mm, the visible light transmittance Ya 85% or greater and most preferably 90% or greater, and the haze value no greater than 0.1%.

DETAILED DESCRIPTION OF THE INVENTION

Examples of the invention will now be explained in detail, with the understanding that the invention is in no way limited by these examples.

In the following examples and comparative examples, the optical properties were measured according to JIS-R3106 for the reflectivity and reflection color tone, and according to the following methods for the surface roughness, abrasion resistance and contamination resistance.

Film reflectivity 1: The reflectivity for incident light from the film side at an incident angle of 12° was measured according to JIS-R3106 with respect to standard light A specified by JIS-Z8720, as the reflectivity including no reflection from the glass back side. The terms "reflectivity" and "film reflectivity" refer to this film reflectivity 1.

Film reflectivity 2: The reflectivity for incident light from the film side at an incident angle of 12° was measured, as reflectivity including reflection on the glass back side.

Total light transmittance and haze value: An integrating sphere light transmittance meter ("HGM-2DP", product of Suga Test Instruments Co., Ltd., C-light source, light incident from film side) was used for measurement of the total light transmittance and haze value by the haze value measuring method described in JIS K7105-1981 (Plastic Optical Properties Test).

Reflection color tone (a, b): A C-light source was used incident at an angle of 12° from the film side, and the reflected color of the reflection light including the reflection on the glass back side was measured according to JIS-Z8729, and expressed as the Hunter color coordinate value.

Taber abrasion 1: Following the standard of JIS-R3221, a CS-10F rotating wheel was used for 200 rotations under a load of 500 g, and then the presence or absence of film was examined. The symbol "○" was used to denote film remaining over the entire surface, "Δ" was used to denote film partially remaining, and "×" was used to denote absolutely no film. The values in parentheses indicate the increase in haze value after the Taber abrasion (value of "[haze value (%) after Taber abrasion test]–[haze value (%) before Taber abrasion test]").

Taber abrasion 2: Same as Taber abrasion 1, except that evaluation was made under conditions with a 500 g load and 1000 rotations.

Fastness: The results with a dry flannel fabric traverse tester ("HEIDON-18", product of Shinto Kagaku Co., 500 g/cm² load, 1000 passes) were evaluated based on the haze value and total light transmittance before and after the test. The Taber abrasion 1, Taber abrasion 2 and fastness are all evaluations of the film abrasion resistance, with the Taber abrasion 2 being the most stringent abrasion resistance test, followed by the Taber abrasion 1 and the fastness test. The Taber abrasion 1 and Taber abrasion 2 are suitable abrasion resistance evaluations for uses such as automobile and building windows, while the fastness is a suitable abrasion resistance evaluation for uses such as solar cell glass base substrates.

Surface roughness (Ra): The surface roughness Ra was measured with an atomic force microscope (AFM, "SPI3700" by Seiko Electronics) in a measuring range of 2 μm×2 μm.

Contamination resistance: A finger was pressed against the film side of the glass to create a fingerprint, and this was subjected to exhaled breath and wiped with tissue paper. After again subjecting it to exhaled breath, the condition of the fingerprint residue was observed and the change in reflectivity before and after creating the fingerprint and wiping with tissue paper was judged according to the following scale.
Scale:
○: No shape of fingerprint visible, no change in reflectivity before and after wiping
Δ: Shape of fingerprint visible, but no change in reflectivity before and after wiping
×: Shape of fingerprint visible, and change in reflectivity before and after wiping

EXAMPLE 1

While stirring 40 g of a silica fine particle dispersion ("SNOWTEX OL" by Nissan Chemical Co., mean particle size: 50 nm, particle size standard deviation: 1.4, average ratio of long axis length to short axis length: 1.1, solid portion: 20%), there were added thereto 52.1 g of ethylcellosolve, 1 g of concentrated hydrochloric acid and 6.9 g of tetraethoxysilane in that order, and after further stirring for 120 minutes, the mixture was stationed for 120 hours for reaction. A 6 g portion of ethylcellosolve was then added to 4 g of this sol for dilution to prepare a coating solution with a solid portion of 4%.

This coating solution was used to form a film by spin coating onto one side of a green-colored float glass base substrate having a composition of soda lime silicate glass and a thickness of 3.4 mm (refractive index=1.52, visible light transmittance Ya=81.3%, total light transmittance=81.1%, sunlight transmittance Tg=60.8%, ultraviolet transmittance Tuv(iso)=26.9%, visible light reflectivity=7.4%, Hunter color coordinate transmitted color L=90.7, a=−4.5, b=0.8, reflected color L=27.3, a=−1.3, b=−0.4), and then it was placed in a 700° C. electric oven for 2 minutes to obtain a low reflection glass sheet coated with a low reflection film with an average thickness of 128 nm. The maximum temperature reached by heating in the electric oven was 630° C. The image of the edge section (cross-section) of the film of the resulting film-formed glass sheet taken with an electron microscope (100,000× magnification) as seen from an inclination of 300 from the film plane was the same as in FIG. 1 explained above.

EXAMPLE 2

The same procedure was followed as in Example 1, except that the average film thickness was 105 nm. The average film thickness was adjusted to satisfy conditions for minimum visible light reflectivity. The average film thickness was similarly adjusted in the following Examples 3–5 and Comparative Examples 1–7.

EXAMPLE 3

Figure 3:
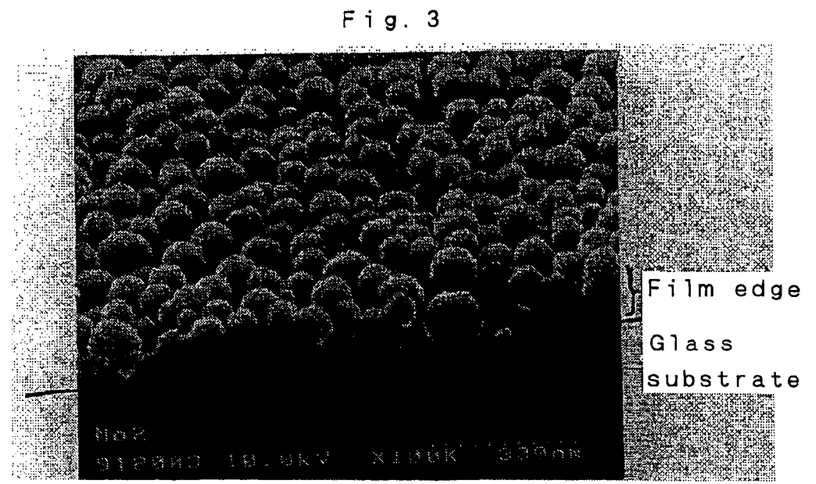
FIG. 3 is an electron microscope image of the structure of a low reflection film according to another example of the invention.

While stirring 21.3 g of a silica fine particle dispersion ("SNOWTEX YL" by Nissan Chemical Co., mean particle size: 70 nm, particle size standard deviation: 1.3, average ratio of long axis length to short axis length: 1.1, solid portion: 40%), there were added thereto 21.3 g of water, 51.3 g of ethylcellosolve, 1 g of concentrated hydrochloric acid and 5.2 g of tetraethoxysilane in that order, and reaction was conducted for about 4 hours. A 6 g portion of ethylcellosolve was then added to 4 g of this sol to prepare a coating solution. A film was formed on a 2.0 mm thick glass base substrate having the same composition as the base substrate used in Example 1 (visible light transmittance Ya=85.3%, total light transmittance =85.4%, sunlight transmittance Tg=71.0%, ultraviolet transmittance Tuv(iso) =61.6%, visible light reflectivity=7.6%, Hunter color coordinate transmitted color a=−2.9, b=0.4, reflected color a=−0.1, b=−0.8), and heat treatment was carried out in the same manner as Example 1. The average thickness of the resulting film was 123 nm. The image of the edge section (cross-section) of the film of the resulting film-formed glass sheet taken with an electron microscope (100,000 magnification) as seen from an inclination of 30° from the film plane is shown in FIG. 3.

EXAMPLE 4

Figure 4:
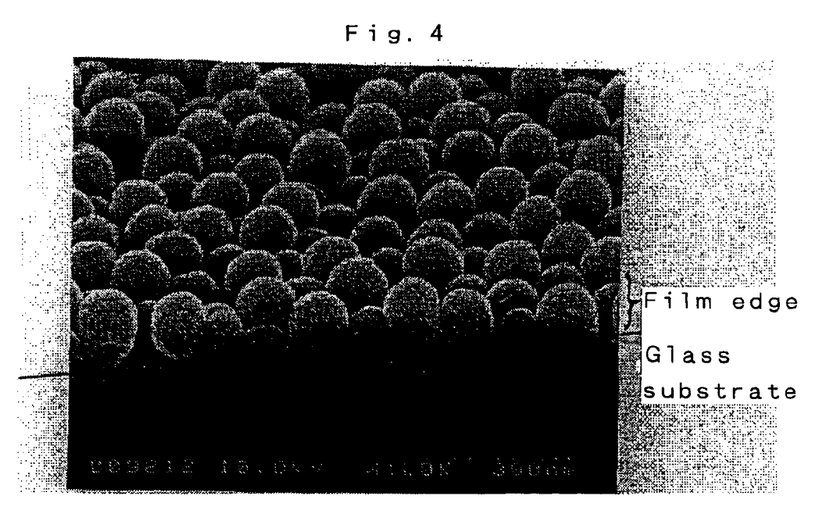
FIG. 4 is an electron microscope image of the structure of a low reflection film according to yet another example of the invention.

While stirring 50.0 g of a silica fine particle dispersion ("SEAHOSTAR KE-W10" by Nippon Shokubai Co., Ltd., mean particle size: 110 nm, particle size standard deviation: 1.1, average ratio of long axis length to short axis length: 1.03, solid portion: 15%), there were added thereto 40.3 g of ethanol, 8.7 g of tetraethoxysilane and 1.0 g of concentrated nitric acid in that order, and reaction was conducted for 3 hours. After adjusting the solid portion to 3%, a film was formed on one side of a colorless transparent (clear) 2.8 mm thick float glass base substrate having a composition of soda lime silicate glass (refractive index=1.52, visible light transmittance Ya=89.9%, total light transmittance=89.7%, sunlight transmittance Tg=84.3%, ultraviolet transmittance Tuv (iso)=61.3%, Hunter color coordinate transmitted color L=94.9, a=−1.0, b=0.2, reflected color L=28.3, a=−0.4, b=−0.6). The coated glass was subjected to 30 minutes of heat treatment in an electric oven heated to 500° C. The average thickness of the resulting film was 163 nm. The image of the edge section (cross-section) of the film of the resulting film-formed glass sheet taken with an electron microscope (100,000 magnification) as seen from an inclination of 300 from the film plane is shown in FIG. 4.

EXAMPLE 5

A coating solution was prepared by mixing 53.3 g of a linear(chain-like) aggregated silica fine particles dispersion ("SNOWTEX OUP" by Nissan Chemical Co., Ltd., mean primary particle size: 25 nm, average length: 100 nm, solid portion: 15%), 38.8 g ethanol, 1 g of 3 mole/L hydrochloric acid and 6.9 g of tetraethoxysilane and reacting the mixture for 12 hours. This coating solution was used to form a film by spin coating onto one side of the same type of glass base substrate as in Example 1, and then it was placed in a 600° C. electric oven for 10 minutes to obtain a low reflection glass sheet coated with a low reflection film with an average thickness of 120 nm. The maximum temperature reached by heating in the electric oven was 590° C.

Table 2 lists the silica fine particle form (as either non-aggregated fine particles or linear aggregated fine particles, or listed as "mixed" when two types of fine particles are combined), the mean particle size of the silica fine particles (or the mean primary particle size in the case of linear (chain-like) aggregated silica fine particles), the binder content in the film (wt %), the silica fine particle content (wt %), the final film thickness (average film thickness), whether the silicon alkoxide was hydrolyzed in the presence of the silica fine particles during preparation of the coating solution ("hydrolysis with particles"), the number of fine particles in the film in a 1 $\mu$m×1 $\mu$m square area as observed from above the film using an electron microscope (fine particle density), and the type of glass base substrate (color and thickness (mm)) for Examples 1 to 5 above, as well as the evaluation results for the film reflectivity 1, film reflectivity 2, haze value (%), reflection color tone a/b, Taber abrasion 1, Taber abrasion 2, surface roughness Ra (nm) and contamination removal property for the resulting low reflection glass sheets. The values for the reflected light hue $[(a^2+b^2)^{1/2}]$ calculated from the reflection color tone were 4 or less in all the examples.

TABLE 2

|  | Example 1 | Example 2 | Example 3 | Example 4 | Example 5 |
| --- | --- | --- | --- | --- | --- |
| Silica fine particles | Non-aggre-gated | Non-aggre-gated | Non-aggre-gated | Non-aggre-gated | Linear (chain-like) aggregated |
| Mean particle size | 50 nm | 50 nm | 70 nm | 110 nm | 25 nm |
| Binder content | 20% | 20% | 15% | 25% | 20% |
| Silica fine particle content | 80% | 80% | 85% | 75% | 80% |
| Average film thickness | 128 nm | 105 nm | 123 nm | 163 nm | 120 nm |
| Hydrolysis with particles | yes | yes | yes | yes | yes |
| Fine particle density (1 $\mu$m square) | 800 | 750 | 500 | 180 | 2700 |
| Base substrate (color, thickness mm) | Green 3.4 | Green 3.4 | Green 2.0 | Clear 2.8 | Green 3.4 |
| Film reflectivity 1 | 1.3% | 0.9% | 0.6% | 0.3% | 0.4% |
| Film reflectivity 2 | 4.7% | 4.3% | 4.0% | 4.3% | 3.6% |
| Haze value (%) | 0.1 | 0.2 | 0.1 | 0.2 | 0.1 |
| Reflection color tone a/b | −1.3/−3.5 | −1.2/−1.1 | −1.0/−1.9 | −1.5/−2.1 | −1.1/−1.4 |
| Taber Abrasion 1 | ○ (1.3) | ○ (1.2) | ○ (1.0) | ○ (1.3) | ○ (1.9) |
| Taber Abrasion 2 | ○ (1.8) | ○ (1.6) | ○ (1.5) | ○ (1.5) | ○ (2.4) |

TABLE 2-continued

|  | Example 1 | Example 2 | Example 3 | Example 4 | Example 5 |
|---|---|---|---|---|---|
| Ra (nm) | 10.1 | 7.8 | 12.5 | 19.6 | 5.8 |
| Contamination removal property | ◯ | ◯ | ◯ | ◯ | ◯ |

As seen from Table 2, the low reflection glass of Examples 1 to 5 had a low value of 0.3–1.3% for the film reflectivity and particularly for the film reflectivity 1 (reflectivity not including the back side reflection), and a small haze value of 0.1–0.2 and thus excellent through visibility, while also exhibiting excellent abrasion resistance and contamination removal property.

When the reflectivity and reflection color tone were measured after the manufactured low reflection glass of Examples 1 to 5 had been allowed to stand outdoors for 2 months, all of the examples exhibited excellent durability, with no change in the measured values before and after standing outdoors.

The low reflection glass obtained in Example 4 (with the low reflection film facing outside) and the glass base substrate used in Example 4 prior to coating of the low reflection film were each used as the front cover glass for a polycrystalline solar cell (3 serially connected 57 mm 28 mm modules; characteristic values: Pmax(W)=0.57, Voc (V)=1.7, Isc(mA)=450 AM1.5, 100 mW/cm$^2$, 25° C.), for comparative measurement of the current values generated in cloud-free weather. The current value of the former was 397 mA and the current value of the latter was 387 mA, thus indicating an approximately 3% increase in conversion efficiency by the low reflection glass.

A water-repellent film was also coated onto the low reflection film obtained in Example 4, in the following manner. After dissolving 1 g of $CF_3(CF_2)_7(CH_2)_2Si(OCH_3)_3$ (heptadecafluorodecyltrimethoxysilane, product of Toshiba Silicone) in 98 g of ethanol, 1.0 g of 0.1 N hydrochloric acid was further added and the mixture was stirred for one hour to obtain a water-repellent treatment agent.

A cotton cloth was wetted with 3 ml of the water-repellent treatment agent and was used to coat the surface of the low reflection film of the low reflection glass sheet, after which the excess attached water-repellent treatment agent was wiped off with a unused cotton cloth, to obtain water-repellent treated glass.

The static water droplet contact angle of the water-repellent treated glass with a 2 mg water droplet weight was measured using a contact angle meter (CA-DT, product of Kyowa Kaimen Kagaku Co.). The value of the contact angle was approximately 125°, which was a larger value than the approximately 105° contact angle obtained by water-repellent treatment of the untreated glass sheet surface in the same manner as described above and exhibited excellent in water-repellency. The anti-reflection performance and conversion efficiency of the low reflection glass treated with the water-repellent agent were excellent.

All of the film surfaces of Examples 1 to 5 had water contact angles of 5° or less as measured using a contact angle meter (CA-DT, product of Kyowa Kaimen Kagaku Co.) with a 2 mg water droplet weight, thus exhibiting excellent hydrophilicity.

The following examples (Examples 6–10) are applications to solar cell glass sheets.

EXAMPLE 6

There were mixed 32.0 g of a first silica fine particle dispersion ("SNOWTEX OL" by Nissan Chemical Co., Ltd., mean particle size: 50 nm, solid portion: 20%) and 8.0 g of a second silica fine particle dispersion ("SEAHOSTAR KE-W30" by Nippon Shokubai Co., Ltd., mean particle size: 300 nm, particle size standard deviation: 1.1, average ratio of long axis length to short axis length: 1.02, solid portion: 20%) at a proportion of 4:1 in terms of solid ratio, to obtain 40.0 g of a silica fine particle dispersion (mean particle size: 50 nm, almost equivalent to mean particle size of first silica fine particles). After then adding 52.6 g of ethanol, 0.5 g of 3 mole/L hydrochloric acid and 6.9 g of tetraethoxysilane, the mixture was reacted for 12 hours to prepare a coating solution. The coating solution was spin coated onto the surface of a colorless transparent (clear) 4.0 mm thick float glass base substrate having a composition of soda lime silicate glass (visible light transmittance Ya=88.5%, total light transmittance=88.5%, sunlight transmittance Tg=79.6%, ultraviolet transmittance Tuv(iso)=52.0%, visible light reflectivity=7.7%, Hunter color coordinate transmitted color L=94.3, a=−1.7, b=0.2, reflected color L=27.8, a=−0.5, b=−0.6), and then held for 10 minutes in an electric oven at 500° C. to obtain a low reflection glass sheet coated with a low reflection film (average film thickness: 250 nm) having a haze value of 5.1%.

Example 7

While stirring 40 g of a silica fine particle dispersion ("KE-W50" by Nippon Shokubai Co., Ltd., mean particle size: 550 nm, particle size standard deviation: 1.1, average ratio of long axis length to short axis length: 1.02, solid portion: 20%), there were added thereto 52.1 g of ethylcellosolve, 1 g of concentrated hydrochloric acid and 6.9 g of tetraethoxysilane in that order, and reaction was conducted while stirring for 240 minutes to obtain a sol. A 3 g portion of ethylcellosolve and 4 g of hexyleneglycol were then added to 3 g of this sol for dilution to prepare a coating solution with a solid portion of 3%.

This coating solution was used to form a film by spin coating onto one side of a float glass base substrate with the same composition and thickness as in Example 4, and then it was placed in a 700° C. electric oven for 2 minutes to obtain a low reflection glass sheet coated with a low reflection film with a haze value of 51.7% (average thickness: 560 nm). The maximum temperature reached by heating in the electric oven was 630° C.

EXAMPLE 8

While stirring 40 g of a silica fine particle dispersion ("KE-E70" by Nippon Shokubai Co., Ltd., mean particle size: 740 nm, particle size standard deviation: 1.1, average ratio of long axis length to short axis length: 1.02, solid portion: 20%), there were added thereto 52.1 g of ethylcellosolve, 1 g of concentrated hydrochloric acid and 6.9 g of tetraethoxysilane in that order, and reaction was conducted while stirring for 240 minutes. A 4 g portion of hexyleneglycol was then added to 6 g of this sol for dilution to prepare a coating solution with a solid portion of 6%. This coating solution was used to form a film by spin coating onto one side of a float glass base substrate with the same composition and thickness as in Example 7, and then it was placed in a 700° C. electric oven for 2 minutes to obtain a low reflection glass sheet coated with a low reflection film with a haze value of 69.5% (average thickness: 750 nm).

EXAMPLE 9

While stirring 35 g of a silica fine particle dispersion ("KE-W30" by Nippon Shokubai Co., Ltd., mean particle size: 300 nm, solid portion: 20%), there were added thereto 52.1 g of ethylcellosolve, 1 g of concentrated hydrochloric acid and 10.4 g of tetraethoxysilane in that order, and reaction was conducted while stirring for 300 minutes. A 4 g portion of hexyleneglycol was then added to 3 g of this sol for dilution to prepare a coating solution with a solid portion of 3%. This coating solution was used to form a film by spin coating onto one side of a float glass base substrate with the same composition and thickness as in Example 7, and then it was placed in a 700° C. electric oven for 2 minutes to obtain a low reflection glass sheet coated with a low reflection film with a haze value of 18.2% (average thickness: 320 nm).

EXAMPLE 10

A mixture of 16 g of the fine particle-containing hydrolyzed solution used in Example 4 (mean particle size: 110 nm), 24 g of the fine particle-containing hydrolyzed solution used in Example 7 (mean particle size: 550 nm), 20 g of ethylcellosolve and 40 g of hexyleneglycol was prepared to obtain a coating solution. This coating solution was coated by gravure coating onto the surface of the same type of glass base substrate used in Example 6, and then it was placed in a 500° C. electric oven for 10 minutes to obtain a low reflection glass sheet coated with a low reflection film with a haze value of 27.2% (average thickness: 570 nm).

There was no change in the reflectivities and reflection color tones of the low reflection glass of Examples 6 to 10 upon remeasurement after 2 months, and the measured values were all within the range of instrument error.

Table 3 lists the silica fine particle form (as either non-aggregated fine particles or linear (chain-like) aggregated fine particles, or listed as "mixed" when two types of fine particles are combined), the silica fine particle dimensions (mean particle size), the binder content in the film (wt %), the silica fine particle content (wt %), the final film thickness (average film thickness), whether the silicon alkoxide was hydrolyzed in the presence of the silica fine particles during preparation of the coating solution ("hydrolysis with particles"), the number of fine particles in the film in a 100 square $\mu m$ area (10 $\mu m \times$ 10 $\mu m$) as observed from above the film using an electron microscope (fine particle density), and the type of glass sheet of the base substrate(color and thickness (mm)) for Examples 6 to 10 above, as well as the evaluation results for the film reflectivity 1 and 2, reflection color tone a/b, contamination removal property, initial haze value (%), initial total light transmittance (%) and the haze value (%) and total light transmittance (%) after a fastness test (1000 passes with load of 500 g/cm$^2$) for the resulting low reflection glass sheets. The values for the reflected light hue $[(a^2+b^2)^{1/2}]$ calculated from the reflection color tone were 4 or less in all the examples. As seen in Table 3, the low reflection glass sheets obtained in Examples 6 to 8 and Example 10 had higher total light transmittance than the total light transmittance of the glass base substrates, while the low reflection glass sheet obtained in Example 9 had total light transmittance roughly equivalent to the total light transmittance of the glass sheet base substrate. The low reflection glass of Examples 6 to 10 had high haze values and were therefore not very suitable as window glass for automobiles or construction, but they could be suitably used as solar cell base substrate glass sheets or solar water heater glass sheets.

TABLE 3

|  | Example 6 | Example 7 | Example 8 | Example 9 | Example 10 |
| --- | --- | --- | --- | --- | --- |
| Silica fine particles | Non-aggregated/mixture | Non-aggregated | Non-aggregated | Non-aggregated | Non-aggregated/mixture |
| Mean particle size | 50 nm | 550 nm | 740 nm | 300 nm | 160 nm |
| Binder content | 20% | 20% | 20% | 30% | 22% |
| Silica fine particle content | 80% | 80% | 80% | 70% | 78% |
| Average film thickness | 250 nm | 560 nm | 750 nm | 320 nm | 570 nm |
| Hydrolysis with particles | yes | yes | yes | yes | yes |
| Fine particle density (10 $\mu m$ square) | 650 | 100 | 30 | 300 | 6500 |
| Base substrate (color, thickness mm) | Clear 4.0 | Clear 2.8 | Clear 2.8 | Clear 2.8 | Clear 4.0 |
| Film reflectivity 1 | 0.5% | 0.2% | 0.2% | 0.3% | 0.2% |
| Film reflectivity 2 | 4.3% | 2.6% | 2.9% | 3.9% | 3.4% |
| Reflection color tone a/b | −1.9/0 | 1.0/−1.3 | −0.3/0.8 | −0.8/−0.8 | −0.1/0.9 |
| Contamination removal property | ○ | ○ | ○ | ○ | ○ |
| Initial haze value (%) | 5.1 | 51.7 | 69.5 | 18.2 | 27.1 |
| Initial total light transmittance (%) | 91.5 | 91.2 | 90.5 | 89.5 | 91.4 |
| After fastness test |  |  |  |  |  |
| Haze value (%) | 5.3 | 52.6 | 70.8 | 19.0 | 28.5 |
| Total light transmittance (%) | 91.4 | 91.3 | 90.7 | 89.5 | 91.2 |

In Examples 6 to 10, the changes in the film reflectivities 1 and 2 and the reflection color tones were within the measuring error ranges for the spectrophotometer, and no change was found in the optical thickness. After the fastness test, the haze values increase slightly, but the total light transmittances were virtually unchanged, and therefore since there was no decrease in diffused transmitted light due to scattering of light by the fine particles, this demonstrated that the fine particles had adhered firmly to the glass base substrates.

Comparative Example 1

After adding 45 g of ethanol, 8.67 g of tetraethoxysilane and 1 g of concentrated hydrochloric acid in that order to 12.5 g of a silica fine particle dispersion ("SNOWTEX OL" by Nissan Chemical Co., mean particle size: 50 nm, solid portion: 20%), the mixture was stirred for 24 hours for hydrolysis reaction. This was further diluted with ethylcellosolve to obtain a coating solution (containing silica fine particles and ethyl silicate in a weight ratio of 1:1 in terms of silica).

Comparative Example 2

After mixing 36.8 g of ethanol and 7.2 g of 3 mole/L hydrochloric acid to 15.2 g of tetramethoxysilane, the mixture was reacted for 12 hours to hydrolyze the tetramethoxysilane. This hydrolyzed solution was then mixed with 160 g of a linear(chain-like) aggregated silica fine particle dispersion ("SNOWTEX-OUP" by Nissan Chemical Co., mean primary particle size: 25 nm, solid portion: 15%) to prepare a coating solution.

COMPARATIVE EXAMPLE 3

After adding 29 g of ethylcellosolve and 10 g of 1 mole/L hydrochloric acid to 21 g of tetraethoxysilane while stirring, the mixture was reacted for 12 hours. A 3.3 g portion of this reaction solution was mixed with 3.3 g of a silica fine particle dispersion ("SNOWTEX OL", by Nissan Chemical Co., mean particle size: 50 nm, solid portion: 20%) and diluted with ethylcellosolve to obtain a coating solution.

COMPARATIVE EXAMPLE 4

After adding 74.53 g of ethanol, 3.47 g of tetraethoxysilane and 2 g of concentrated hydrochloric acid in that order to 20 g of a silica fine particle dispersion ("SNOWTEX 0" by Nissan Chemical Co., mean particle size: 30 nm, solid portion: 20%), the mixture was stirred for 18 hours for hydrolysis reaction. This was further diluted with ethylcellosolve to obtain a coating solution (containing silica fine particles and ethyl silicate in a weight ratio of 4:1 in terms of silica).

COMPARATIVE EXAMPLE 5

Twenty grams of a silica fine particle dispersion ("SNOWTEX 0" by Nissan Chemical Co., mean particle size: 30 nm, solid portion: 20%) and 10 g of a hydrolyzed polycondensate of ethyl silicate (trade name: HAS-10 by Colcoat Co., Ltd., $SiO_2$ 10 wt % content) were added in that order to 70 g of ethanol to prepare a coating solution (containing silica fine particles and ethyl silicate in a weight ratio of 4:1 in terms of silica).

COMPARATIVE EXAMPLE 6

After mixing 8.4 g of tetramethoxysilane, 53.8 g of ethanol and 4.5 g of 3 mole/L hydrochloric acid, the mixture was reacted for 24 hours to obtain a hydrolyzed solution. After further adding 33.3 g of a silica fine particle dispersion ("SNOWTEX OL", by Nissan Chemical Co., mean particle size: 50 nm, solid portion: 20%), ethylcellosolve was added for dilution to obtain a coating solution.

COMPARATIVE EXAMPLE 7

After mixing 8.4 g of tetramethoxysilane, 57.3 g of ethanol and 1.0 g of 3 mole/L hydrochloric acid with 33.3 g of a silica fine particle dispersion ("SNOWTEX 0", by Nissan Chemical Co., mean particle size: 30 nm, solid portion: 20%), the mixture was reacted for 12 hours for hydrolysis of the tetramethoxysilane to prepare a coating solution. This was used for coating, drying and heat treatment in the same manner as Example 1 using the same type of glass base substrate as in Example 1 (green colored, 3.4 mm thickness) to obtain a glass sheet having a silica irregular film with a thickness of 125 nm formed on each surface thereof.

The coating solutions prepared in Comparative Examples 1 to 7 were used for the same coating and heat treatment as in Example 1, using the same type of glass base substrate used in Example 1 (green colored, 3.4 mm thickness), except that the heat treatment was carried out for 10 minutes in a 600° C. electric oven instead of the heat treatment for 2 minutes in the 700° C. electric oven in Example 1, to obtain glass coated with silica irregular films having the thicknesses shown in Tables 4 and 5. The evaluation results for the glass sheets are shown in Tables 4 and 5. The indication "undetermined" under the column "Fine particle density" means that the fine particles were embedded in the binder so that the number of fine particles could not be counted.

The results in Table 4 demonstrate the following for each of the comparative examples. The film reflectivity was higher in Comparative Example 1 in which the binder content exceeded 40%. The abrasion resistance and contamination removal property were inferior in Comparative Examples 2 and 5 in which the mean particle size of the non-aggregated silica fine particles was less than 40 nm and no "hydrolysis with silica fine particles" had been carried out. The film reflectivity was also higher and the abrasion resistance inferior in Comparative Example 3 in which no "hydrolysis with silica fine particles" had been carried out. In Comparative Example 4 in which the mean particle size of the non-aggregated silica fine particles was less than 40 nm, the film reflectivity, and especially the film reflectivity 1 not including the back side reflectivity, was high and the contamination removal property was inferior. The abrasion resistance was inferior in Comparative Example 6 in which the binder content exceeded 40% and no "hydrolysis with silica fine particles" had been carried out. The film reflectivity was high in Comparative Example 7 in which the mean particle size of the non-aggregated silica fine particles was less than 40 nm and the binder content exceeded 40%.

TABLE 4

|  | Comparative Example 1 | Comparative Example 2 | Comparative Example 3 | Comparative Example 4 |
| --- | --- | --- | --- | --- |
| Silica fine particles | Non-aggregated | Linear (chain-like) aggregated | Non-aggregated | Non-aggregated |
| Mean particle size | 50 nm | 25 nm | 50 nm | 30 nm |
| Binder content | 50% | 20% | 33% | 20% |
| Silica fine particle content | 50% | 80% | 67% | 80% |
| Average film thickness | 125 nm | 110 nm | 120 nm | 110 nm |
| Hydrolysis with particles | yes | no | no | yes |
| Fine particle density (1 μm square) | 850 | 2800 | 650 | 2500 |
| Base substrate (color, thickness mm) | Green 3.4 | Green 3.4 | Green 3.4 | Green 3.4 |
| Film reflectivity 1 (%) | 2.4 | 0.5 | 1.9 | 1.9 |
| Film reflectivity 2 (%) | 5.8 | 3.8 | 5.3 | 5.3 |
| Haze value (%) | 0.1 | 5.1 | 0.4 | 0.1 |

TABLE 4-continued

|  | Comparative Example 1 | Comparative Example 2 | Comparative Example 3 | Comparative Example 4 |
|---|---|---|---|---|
| a/b | −1.2/−1.0 | −1.5/−0.5 | −1.4/−0.1 | −1.1/−1.0 |
| Taber abrasion 1 | ○ (1.5) | X | X | ○ (1.2) |
| Taber abrasion 2 | ○ (1.6) | X | X | ○ (1.4) |
| Contamination removal property | ○ | X | ○ | Δ |

TABLE 5

|  | Comparative Example 5 | Comparative Example 6 | Comparative Example 7 |
|---|---|---|---|
| Silica fine particles | Non-aggregated | Non-aggregated | Non-aggregated |
| Mean particle size | 30 nm | 50 nm | 30 nm |
| Binder content | 20% | 67% | 67% |
| Silica fine particle content | 80% | 33% | 33% |
| Average film thickness | 110 nm | 130 nm | 120 nm |
| Hydrolysis with particles | no | no | yes |
| Fine particle density | 2300 | 800 | undetermined |
| Base substrate (color, thickness mm) | Green 3.4 | Green 3.4 | Green 3.4 |
| Film reflectivity 1 (%) | 1.9 | 1.6 | 3.3 |
| Film reflectivity 2 (%) | 5.4 | 4.9 | 6.7 |
| Haze value (%) | 0.1 | 0.2 | 0.1 |
| a/b | −1.2/0.1 | −1.4/−0.6 | −1.1/−1.0 |
| Taber abrasion 1 | X | X | ○ (1.2) |
| Taber abrasion 2 | X | X | ○ (1.4) |
| Contamination removal property | X | ○ | ○ |

COMPARATIVE EXAMPLE 8

One side of a float glass base substrate with the same composition and thickness as the one used in Example 4 was rubbed with #100 polishing sand to prepare surface-roughened frosted glass. The haze value and total light transmittance of the frosted glass were measured with a haze meter. The haze value was 82.6% and the total light transmittance was 75.4%. The mechanical strength of the frosted glass fell to about 40% of the original glass strength.

COMPARATIVE EXAMPLE 9

Frosted glass was prepared in the same manner as Comparative Example 8 except that #1000 polishing sand was used instead of the #100 polishing sand in Comparative Example 8, and the haze value and total light transmittance Thereof were measured. The haze value was 81.4% and the total light transmittance was 83.0%. The mechanical strength of the frosted glass fell to about 50% of the original glass strength.

Industrial Applicability

According to the present invention, a coating solution obtained by hydrolysis of a hydrolyzable metal compound in the presence of silica fine particles is used, with relatively large silica fine particles or with a specified proportion of silica fine particles and binder, to obtain much lower reflectivity and high film strength, while improving contamination removal and eliminating changes in reflectivity with time.

Also according to the present invention, warping of the glass due to film contraction is completely eliminated even when the glass base substrate is heated at above the softening temperature. This is because the film is composed of mainly silica fine particles that undergo almost no contraction, and therefore the bond between the film and glass is reduced and the contact between the particles is minimal. Particularly in the case of a film obtained by co-hydrolysis, the binder concentration on the surfaces of the silica fine particles increases, such that the binder forms no film on the glass base substrate surface and the contraction force of the binder does not act as easily on the glass. Consequently, even with formation into a curved shape such as for automobile glass, for example, the same working may be carried out as for film-free glass, and production costs may therefore be reduced. It is suitable also for uses such as solar cell base substrates and building windows as well, since the flatness of the glass can be maintained even when high temperature treatment is carried out for enhanced film strength.

Also according to the present invention, the uppermost surface of the low reflection glass has an irregular shape, so that the hydrophilicity of the silicon dioxide is improved and the glass surface is more resistant to fogging by moisture adhesion. Even when water droplets adhere, the contact angle is small and the surface is highly hydrophilic, and therefore contamination such as dust is easily washed off. Since the water droplets do not easily remain, the glass has a contamination resistant property whereby contamination such as water tracks are less prone to form on the surface.

A single layer low reflection film according to the invention not only is less costly to manufacture than a multilayer film, but its reflectivity performance also provides lower reflection across a wide wavelength range and less increase in reflectivity with respect to the incident angle, while the degree of reflected light hue is also smaller. Such performance is useful particularly for automobile window and solar cell glass sheets. The lower reflection increases light transmittance and thus offers suitability for glass of solar cells that convert light to other forms of energy, while it is possible to obtain low reflection glass articles having total light transmittance that is equivalent to or higher than the total light transmittance of the glass base substrates used, and particularly total light transmittance of 88% or greater.

The low reflection glass articles of the invention can be used for window glass of vehicles such as automobiles, trains and the like that require particularly good through visibility and recognizability with low reflection of objects inside the vehicles; for front glass sheets of building windows, show windows, image display devices and the like or optical glass articles; for front glass sheets of solar water heaters; and for glass sheets in solar cells such as the front glass sheets of solar cell panels or the glass sheets used for solar cell base substrates.

What is claimed is:

1. A low reflection glass article obtained by forming a low reflection film composed of silica fine particles and a binder composed of metal compounds on a glass base substrate, the low reflection glass article being characterized in that said low reflection film contains said silica fine particles and said binder in a weight ratio proportion of 60:40 to 95:5, and in that said low reflection film is formed by coating a coating solution onto the glass base substrate and subjecting it to heat treatment, said coating solution being prepared by adding a hydrolyzable metal compound (1) in a state before hydrolyzation, to a mixture of starting fine particles (2) comprising non-aggregated silica fine particles with a mean particle size of 40–1000 nm and/or linear (chain-like) aggregated silica fine particles with a mean primary particle size or 10–100 nm, water (3), and a solvent (4), and then hydrolyzing the hydrolyzable metal compound in the presence of an acid catalyst, the acid catalyst being added before or after the addition of the hydrolyzable metal compound to the starting fine particles, and the coating solution undergoing a condensation reaction between a product of the hydrolysis and a silanol present on said silica fine particles, such that the binder covers surfaces of the silica fine particles, enhancing an adhesion between the silica fine particles.

2. A low reflection glass article according to claim 1, wherein said hydrolyzable metal compound is at least one type of metal alkoxide selected from the group consisting of silicon alkoxides, aluminum alkoxides, titanium alkoxides, zirconium alkoxides and tantalum alkoxides, and said binder is the oxide of the metal of said metal compound.

3. A low reflection glass article according to claim 1 or 2, wherein said low reflection film contains the silica fine particles and the binder in a proportion of 65:35 to 85:15 by weight.

4. A low reflection glass article according to claim 1, wherein the non-aggregated silica fine particles in said coating solution have a long axis length to short axis length ratio of 1.0–1.2.

5. A low reflection glass article according to claim 1, wherein the non-aggregated silica fine particles in said coating solution have a primary particle size standard deviation of 1.0–1.5.

6. A low reflection glass article according to claim 1, wherein said starting fine particles consist only of said non-aggregated silica fine particles with a mean particle size of 40–500 nm.

7. A low reflection glass article according to claim 1, wherein said starting fine particles consist only of said non-aggregated silica fine particles with a mean particle size of 100–1000 nm.

8. A low reflection glass article according to claim 1, wherein said starting fine particles consist only of said non-aggregated silica fine particles, and said non-aggregated silica fine particles comprise
  (1) 70–95 wt % of a first type of non-aggregated silica fine particles with a mean particle size of 40–200 nm and
  (2) 5–30 wt % of a second type of non-aggregated silica fine particles with a mean particle size of from more than 200 nm to 3000 nm or less and at least 100 nm larger than the mean particle size of tile first type of non-aggregated silica fine particles.

9. A low reflection glass article according to claim 6, wherein said low reflection film has 30–3000 fine particles present in a 1 $\mu$m×1 $\mu$m square area of the surface of the film as seen from above the film, and the fine particles have a mean particle size of 40–500 nm.

10. A low reflection glass article according to claim 7, wherein said low reflection film has 10–50,000 fine particles present in a 10 $\mu$m×10 $\mu$m square area of the surface of the film as seen from above the film, and the fine particles have a mean particle size of 100–1000 nm.

11. A low reflection glass article according to claim 6 or 7, wherein said low reflection film has 5,000,000/$D^2$ to 10,000,000/$D^2$ fine particles with a mean particle size Dnm of 40–1000 nm present in a 10 $\mu$m×10 $\mu$m square area of the surface of the film as seen from above the film.

12. A low reflection glass article according to claim 1, wherein said low reflection film has only one fine particle or 2–5 stacked fine particles in the direction of film thickness as seen from a cross-section taken in the direction of the thickness.

13. A low reflection glass article according to claim 8, wherein said low reflection film has 50% or less of its surface area occupied by fine particles from said second non-aggregated silica fine particles, as seen from above the film.

14. A low reflection glass article according to claim 1, wherein said binder coats the entire surface of said silica fine particles to a thickness of 1–100 nm and 2–9% of the mean particle, size of said silica fine particles.

15. A low reflection glass article according to claim 1, wherein said low reflection film has an average thickness of from 90 nm to 350 nm.

16. A low reflection glass article according to claim 1, wherein said low reflection film has an average thickness of from 90 nm to 180 nm.

17. A low reflection glass article according to claim 1, wherein said heat treatment is carried out so that the maximum temperature reached by the glass base substrate coated with said coating solution is 200° C. or higher.

18. A low reflection glass article according to claim 1, wherein said low reflection film has a surface roughness (Ra) of 3–50 nm as measured with an AFM (atomic force microscope).

19. A low reflection glass article according to claim 1, wherein said glass base substrate is a sheet, and said reflection film has reflectivity of 2% or less for incident light from the low reflection film side of the sheet glass base substrate at an incident angle of 12° with respect to standard light A specified by JIS-Z8720, as the reflectivity including no reflection from the back side of the sheet glass base substrate.

20. A low reflection glass article according to claim 1, wherein said glass base substrate is a sheet, and said low reflection glass article has a haze value of 30% or less.

21. A low reflection glass article according to claim 1, wherein said glass base substrate is a sheet, and said low reflection glass article has a haze value of 1% or less.

22. A low reflection glass article according to claim 1, wherein said glass base substrate is a sheet, and said low reflection glass article has a total light transmittance equivalent to or higher man the total light transmittance of said glass base substrate, and a haze value of 10–90%.

23. A low reflection glass article according to claim 1, wherein said low reflection glass article is an automobile window.

24. A low reflection glass article according to claim 1, wherein said low reflection glass article is a building window, show window, display glass sheet or optical glass member.

25. A low reflection glass article according to claim 1, wherein said low reflection glass article is a solar cell glass sheet or solar water heater glass sheet.

26. A low reflection glass article for a solar cell or solar water heater, wherein a low reflection film comprising silica fine particles and a binder composed of metal compounds is formed on a float glass substrate with a total light transmittance of 85% or greater and a composition of soda lime silicate glass, the low reflection glass article being characterized in that said low reflection film contains said silica fine particles and said binder in a proportion of 65:35 to 95:5 by weight, said binder being coated onto said silica fine particles to a thickness of 1–100 nm after undergoing hydrolyzatlon in the presence of the silica fine particles, and undergoing a condensation reaction between a product of the hydrolysis and a silanol present on the silica fine particles, and has a total light transmittance equivalent to or higher than the total light transmittance of said glass substrate.

* * * * *